(12) United States Patent
Cuenca et al.

(10) Patent No.: US 12,375,096 B2
(45) Date of Patent: Jul. 29, 2025

(54) DIGITAL-TO-ANALOG CONVERTER AND CORRESPONDING DIGITAL-TO-ANALOG CONVERSION METHOD

(71) Applicant: STMicroelectronics (Rousset) SAS, Rousset (FR)

(72) Inventors: Michel Cuenca, Septemes les Vallons (FR); Didier Davino, Pourrières (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 164 days.

(21) Appl. No.: 18/463,844

(22) Filed: Sep. 8, 2023

(65) Prior Publication Data

US 2024/0097701 A1    Mar. 21, 2024

(30) Foreign Application Priority Data

Sep. 19, 2022   (FR) ...................... 2209414

(51) Int. Cl.
  *H03M 1/70*    (2006.01)
  *H03M 1/08*    (2006.01)
  *H03M 1/78*    (2006.01)

(52) U.S. Cl.
  CPC ........... *H03M 1/70* (2013.01); *H03M 1/0845* (2013.01); *H03M 1/785* (2013.01)

(58) Field of Classification Search
  CPC ....... H03M 1/70; H03M 1/785; H03M 1/0845

USPC .................................................. 341/126, 144
See application file for complete search history.

(56) References Cited

U.S. PATENT DOCUMENTS 10,879,921 B2 * 12/2020 Pardoen ................. G05F 1/595

OTHER PUBLICATIONS

Analog Devices, "Low Cost, 300 MHz Rail-to-Rail Amplifiers," Rev. J, Data Sheet AD8061/AD8062/AD8063, May 1, 2013, 20 pages.
Kester, Walt, "MT-001: Taking the Mystery out of the Infamous Formula, "SNR=6.02N + 1.76dB," and Why You Should Care," Rev. O, Mar. 10, 2005, 250 pages.

* cited by examiner

*Primary Examiner* — Khai M Nguyen
(74) *Attorney, Agent, or Firm* — Slater Matsil, LLP

(57) ABSTRACT

One embodiment provides a digital-to-analog converter that includes an output amplifier configured to be powered with a controllable power supply voltage and a ground reference voltage. The output amplifier is configured to generate an analog output signal having a dynamic range centered on a common-mode voltage. The output amplifier includes a common-mode adaptation circuit configured to position a level of the common-mode voltage at a level located in a middle portion of an interval of voltages located between the power supply voltage and the ground reference voltage, according to an effective level of the power supply voltage.

20 Claims, 7 Drawing Sheets

DIGITAL-TO-ANALOG CONVERTER AND CORRESPONDING DIGITAL-TO-ANALOG CONVERSION METHOD

CROSS-REFERENCE TO RELATED APPLICATIONS

This application claims the benefit of French Patent Application No. 2209414, filed on Sep. 19, 2022, which application is hereby incorporated herein by reference.

TECHNICAL FIELD

Implementations and embodiments relate to the digital-to-analog converters of integrated circuits.

BACKGROUND

Digital-to-analog converters are circuits adapted to convert a digital signal, that is to say typically a code of a piece of binary data, into an analog signal, that is to say typically a voltage signal, the level of which is proportional to the value of the piece of binary data.

Digital-to-analog converters typically include a conversion circuit, converting the digital code into an analog conversion signal, and an output amplifier (usually "buffer"), amplifying the analog conversion signal to provide the output analog signal.

On the one hand, the conversion circuit is powered with a power supply voltage, so that the dynamic range of the analog conversion signal is defined between a ground voltage and the power supply voltage. The dynamic range of an analog signal corresponds to the difference between the minimum voltage that the signal can have, typically 0V or the ground, and the maximum voltage that the signal can have, typically the power supply voltage.

On the other hand, the output amplifier is usually powered with the same power supply voltage as the conversion circuit and generates the output signal with the same dynamic range as the conversion signal. That being said, in practice, there are zones of "dropout" voltages that limit the dynamic range of the output ("output dynamic limitation voltage"), close to the ground voltage and the power supply voltage, for example, at several hundred millivolts.

When the level of the output signal is in the zones of dropout voltages, the amplifier does not function perfectly and the amplitude of the output signal is clipped, which reduces in practice the dynamic range of the output signal.

Conventional solutions proposed increasing the power supply voltage of the output amplifier so as to move the dropout voltage zone beyond the maximum level of the output voltage. This allowed to avoid the clipping in the upper part of the output voltage but not in the lower part, that is to say in the several hundred millivolts close to the ground voltage.

Thus, there is a need to improve the dynamic range of the analog output signal of digital-to-analog converters.

SUMMARY

According to one aspect, an integrated circuit including a digital-to-analog converter is proposed. The integrated circuit comprises an output amplifier adapted to be powered with a controllable power supply voltage and a ground reference voltage, and configured to generate an analog output signal having a dynamic range centered on a common-mode voltage. The output amplifier includes a common-mode adaptation circuit configured to position the level of the common-mode voltage at a level located in a middle portion of the interval of voltages located between the power supply voltage and the ground reference voltage, according to the effective level of the power supply voltage.

"Controllable power supply voltage" means, for example, that the power supply voltage can have various levels, according, for example, to a command of a user, or by being generated outside the integrated circuit at a level chosen by the user. For example, in practice, a controllable power supply voltage interval is specified for a given integrated circuit.

In other words, the level of the common-mode voltage is generated in a middle portion varying according to the effective value of the controllable power supply voltage, thus allowing the output signal to be centered between the controllable power supply voltage and the ground reference voltage. Consequently, the power supply voltage can advantageously be controlled so that the maximum level and the minimum level are respectively located at a distance from the zones of dropout voltages, and thus to avoid the clippings both in the upper part of the dynamic range of the output signal, and in the lower part of the dynamic range of the output signal.

According to one implementation, the digital-to-analog converter comprises a conversion stage configured to generate, from a digital code, an analog conversion signal at the input of the output amplifier and having a dynamic range, the peak-to-peak amplitude of which is equal to a reference voltage, the output amplifier being configured to generate the output signal at the level of the common-mode voltage when the conversion signal is at a level equal to half of the reference voltage.

In other words, the common-mode level corresponds in this implementation to the median value of the piece of input data and of the level of the output signal. It is thus the median value, and the entire dynamic range of the output signal, that are offset relative to an offset of the power supply voltage.

According to one implementation, the conversion stage is configured to have a constant impedance on the input of the output amplifier, the output amplifier being configured to have a unit gain and being adapted to be powered by the controllable power supply voltage at a level greater than or equal to the reference voltage.

This corresponds to an advantageous practical case. That being said, alternatives such as an amplification with a non-unit gain are possible, by adapting the level of the common-mode voltage relative to this gain.

According to one implementation, the common-mode adaptation circuit is configured to position the level of the common-mode voltage at a level located between a lower limit of the middle portion and an upper limit of the middle portion, the level of the lower limit being located at half the amplitude of the dynamic range of the output signal and a margin above the ground voltage, and the upper limit being located at half the amplitude of the dynamic range of the output signal and a margin below the power supply voltage.

The margin above the ground voltage and the margin below the power supply voltage advantageously correspond to the dropout voltages (usually "output dynamic limitation voltage") typically of approximately several hundred millivolts (mV), for example, 200 mV.

According to one implementation, the common-mode adaptation circuit is configured to position the level of the common-mode voltage in the middle portion, upon command of a control signal.

This advantageously allows to provide a user with an additional parameterization, jointly with the parameterization of the controllable power supply voltage.

According to one implementation, the common-mode adaptation circuit is configured to position the level of the common-mode voltage at a level equal to half of the effective power supply voltage.

According to another aspect, a method for digital-to-analog conversion is also proposed comprising an output amplification, powered with a controllable power supply voltage and a ground reference voltage, generating an analog output signal having a dynamic range centered on a common-mode voltage, the method comprising an adaptation of the common-mode voltage at a level positioned in a middle portion of the interval of voltages located between the power supply voltage and the ground reference voltage, according to the effective level of the power supply voltage.

According to one embodiment, the method comprises a generation, from a digital code, of an analog conversion signal at the input of the output amplification and having a dynamic range, the peak-to-peak amplitude of which is equal to a reference voltage, the output amplification generating the output signal at the level of the common-mode voltage when the conversion signal is at a level equal to half of the reference voltage.

According to one embodiment, the output amplification has a unit gain and the controllable power supply voltage has a level greater than or equal to the reference voltage.

According to one embodiment, the adaptation of the common-mode voltage positions the level of the common-mode voltage at a level located between a lower limit of the middle portion and an upper limit of the middle portion, the level of the lower limit being located at half the amplitude of the dynamic range of the output signal and a margin above the ground voltage, and the upper limit being located at half the amplitude of the dynamic range of the output signal and a margin below the power supply voltage.

According to one embodiment, the adaptation of the common-mode voltage positions the level of the common-mode voltage in the middle portion, upon command of a control signal.

According to one embodiment, the adaptation of the common-mode voltage positions the level of the common-mode voltage at a level equal to half of the effective power supply voltage.

BRIEF DESCRIPTION OF THE DRAWINGS

Other advantages and features of the invention will appear upon examination of the detailed description of implementations and embodiments, in no way limiting, and of the appended drawings in which.

DETAILED DESCRIPTION OF ILLUSTRATIVE EMBODIMENTS

Figure 1:
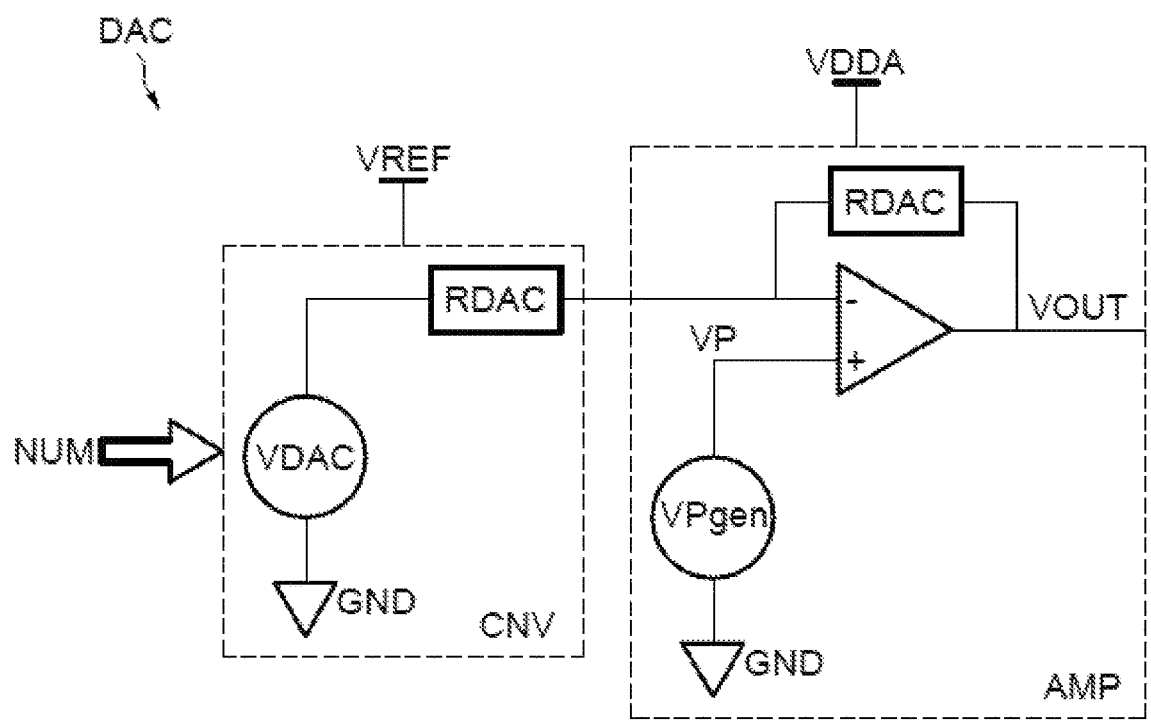
FIG. 1 illustrates an example of a digital-to-analog converter.

FIG. 1 illustrates an example of a digital-to-analog converter DAC, for example, made in a manner integrated into an integrated circuit.

The digital-to-analog converter DAC comprises a conversion stage CNV configured to generate, from a digital code NUM, an analog conversion signal VDAC, and an output amplifier AMP adapted to be powered with a power supply voltage VDDA and a ground reference voltage GND.

The analog conversion signal VDAC is provided at the input of the output amplifier AMP, the latter allowing to retransmit it with an impedance sufficient for the load that receives it. The analog conversion signal VDAC has a dynamic range, that is to say, the peak-to-peak amplitude, equal to a reference voltage VREF, for example, the power supply voltage VREF of the conversion stage CNV.

The power supply voltage VREF of the conversion stage CNV is generated internally by the integrated circuit, typically in a fixed and invariable manner, while the power supply voltage VDDA of the output amplifier AMP is controllable, that is to say that it can have various levels, according, for example, to a command of a user, or by being generated outside the integrated circuit at a level chosen by a user. In practice, an interval of controllable power supply voltages VDDA is specified for a digital-to-analog converter DAC. Typically, in the specifications of the integrated circuit, the power supply voltages of the output amplifier VDDA must be greater than or equal to the reference voltage VREF.

The output amplifier AMP includes, for example, a typical inverting amplifier assembly, that is to say an operational amplifier, the output VOUT of which is relooped onto the inverting input (−) via a resistor RDAC, and the follower input (+) of which is biased to a voltage VP called "common-mode control voltage." Thus, the input of the output amplifier AMP is the inverting input (−) of the operational amplifier, and the latter tends to maintain at zero the voltage difference between the inverting (−) and follower (+) inputs.

For example, the conversion stage CNV is configured to have a constant impedance on the input of the output amplifier AMP, the output amplifier AMP being configured to have a unit gain and being adapted to be powered by the controllable power supply voltage VDDA at a level greater than or equal to the reference voltage VREF.

The output amplifier AMP is configured to generate the output signal VOUT at a voltage called common-mode voltage VMC, when the conversion signal VDAC, at its input, is at a level equal to half of the reference voltage VREF (in general, half of the difference between the reference voltage VREF and the ground voltage GND. That being said, it will be considered that the ground is equal to 0V hereinafter).

The output amplifier AMP is configured to generate an analog output signal VOUT having a dynamic range DYN centered on the common-mode voltage VMC located in a middle portion VMC_PM of the interval of voltages between the power supply voltage VDDA and the ground reference voltage GND, according to the effective level of the power supply voltage VDDA. The output amplifier AMP includes in this respect a common-mode adaptation circuit VPgen configured to generate the common-mode control voltage VP positioning the level of the common-mode voltage VMC in the middle portion VMC_PM.

For example, the middle portion VMC_PM between the power supply voltage VDDA and the ground reference voltage GND is an interval centered on half the value of the power supply voltage VDDA. The width of the interval is moderate, for example, less than +/−10% of VDDA on either side of VDDA/2, for example, the values contained in the middle portion are less than 500 mV, preferably less than 200 mV, from half the value of the power supply voltage VDDA.

In other words, the level of the common-mode voltage VMC is generated in the middle portion VMC_PM established according to the effective value of the controllable power supply voltage VDDA, thus allowing the output signal VOUT to be centered between the controllable power supply voltage VDDA and the ground reference voltage GND, and thus to avoid the clippings both in the upper part of the dynamic range of the output signal and in the lower part of the dynamic range of the output signal.

Figure 2:
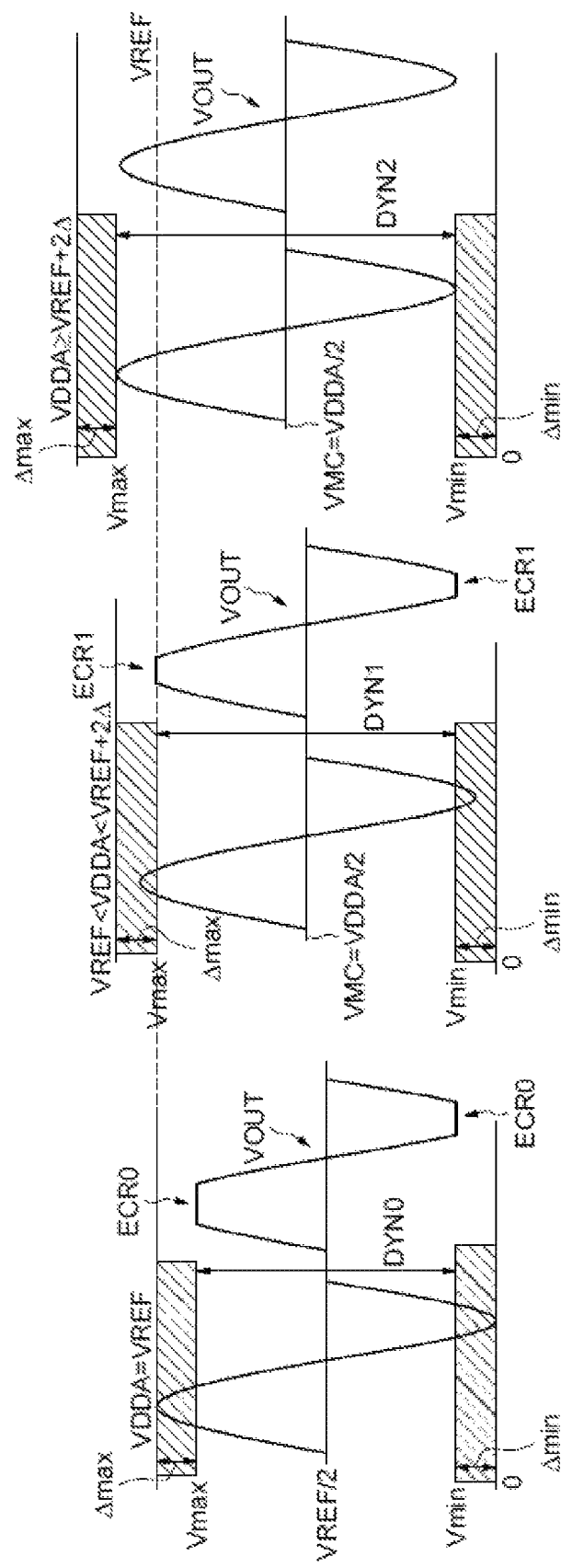
FIG. 2 illustrates an example of the shape of an output signal.

FIG. 2 illustrates in this respect an example of the shape of the output signal VOUT according to three cases on the level of the power supply voltage VDDA of the amplifier AMP, and in the context of a digital-to-analog conversion method implemented in the manner of the device described in relation to FIG. 1, and for a common-mode voltage VMC generated equal to half of the power supply voltage VDDA, "VMC=VDDA/2".

In details, the digital-to-analog conversion method comprises an output amplification, powered with a controllable power supply voltage VDDA, the level of which can vary, for example, upon command of a user, coming from outside the integrated circuit. The amplification allows to generate an analog output signal VOUT having a dynamic range DYN centered on the common-mode voltage VMC. Advantageously, the method comprises an adaptation of the common-mode voltage VMC placing its level in a middle portion of the interval of voltages located between the ground GND and the effective power supply voltage VDDA, in this example at the median level equal to half of the power supply voltage VDDA/2.

In FIG. 2, the example of output signal VOUT is chosen to take up the entire output dynamic range DYN, for example, in the form of a sinusoidal signal, thus centered on the common-mode voltage VMC.

The common-mode adaptation process, implemented by the common-mode adaptation circuit VPgen, comprises a generation of the common-mode control voltage VP such that VMC=VDDA/2, that is to say VOUT=VMC=VDDA/2 when VDAC=VREF/2.

However, by construction in the example of output amplifier AMP described in relation to FIG. 1, VOUT=2*VP−VDAC, and thus, with the conditions VOUT=VDDA/2 and VDAC=VREF/2, VDDA/2=2*VP−VREF/2, or VP=(VDDA+VREF)/4.

Thus, by generating VP=(VDDA+VREF)/4, the common-mode adaptation VPgen allows to control the common-mode voltage VMC equal to half of the power supply voltage VDDA, regardless of the level of the power supply voltage VDDA.

In a first case, shown on the left in FIG. 2, the level of the power supply voltage VDDA is equal to the reference voltage VREF, "VDDA=VREF", which corresponds to a conventional configuration when the common-mode voltage VMC is set to half of the reference voltage VREF, or VMC=VREF/2, without varying with respect to the level of the power supply voltage VDDA.

In the first conventional case, the dynamic range DYN0 of the output signal VOUT should theoretically have a peak-to-peak amplitude equal to the reference voltage VREF. That being said, in practice, there are zones of "dropout" voltages Δmin, Δmax, which limit the dynamic range of the output ("output dynamic limitation voltage"). The dropout voltage Δmin, Δmax zones are close, several hundred millivolts, for example, 200 mV, from the ground voltage GND (Δmin) and from the power supply voltage VDDA (Δmax).

When the level of the output signal VOUT is in the zones of dropout voltages Δmin, Δmax, the amplification AMP does not function perfectly and the amplitude of the output signal VOUT is clipped ECR0, which reduces the dynamic range DYN0 of the output signal. The output signal VOUT is clipped ECR0 at a ceiling level Vmax corresponding to the dropout voltage Δmax zone below the power supply voltage VDDA (or "Vmax=VDDA−Δmax), and at a floor level Vmin corresponding to the dropout voltage Δmin zone above the ground voltage GND (or "Vmin=GND+Δmin).

In a second case, shown on the right in FIG. 2, the level of the power supply voltage VDDA is greater than the reference voltage VREF by a quantity greater than or equal to the range of the dropout voltages Δmin, Δmax, "VDDA≥VREF+2Δ", with, for example, 2Δ=Δmin+Δmax.

In this case, the dynamic range DYN2 of the output signal VOUT is centered on the level of the common-mode voltage VMC, equal to VDDA/2 via the process of adaptation of the common mode VPgen (or the circuit for adaptation of the common-mode VPgen, as described in relation to FIG. 1). Moreover, the output signal VOUT can have its theoretical peak-to-peak amplitude DYN2 equal to the reference voltage VREF.

Indeed, since the power supply voltage VDDA is greater than in the first conventional case, on the one hand the output signal VOUT can have its entire dynamic range DYN2 without being clipped by the ceiling voltage Vmax, and on the other hand, given that the level of the common-mode voltage VMC varies according to the effective level of the power supply voltage VDDA, the output signal VOUT can have its entire dynamic range DYN2 which is also not clipped by the floor voltage Vmin.

In a third case, shown in the middle of FIG. 2, the level of the power supply voltage VDDA is greater than the reference voltage VREF by a quantity smaller than the range of the dropout voltages Δmin, Δmax, "VREF<VDDA<VREF+2Δ", with, for example, 2Δ=Δmin+Δmax.

The dynamic range DYN1 of the output signal VOUT is centered on the level of the common-mode voltage VMC, equal to VDDA/2 via the amplification circuit as described in relation to FIG. 1.

In these conditions, the output signal VOUT is clipped ECR1 by the ceiling level Vmax and by the floor level Vmin.

That being said, the clippings ECR1 are not only moderate with respect to the first conventional case, but also distributed between the lower part and the upper part of the dynamic range DYN1 of the output signal VOUT.

Indeed, in the first conventional case in which the common-mode voltage VMC is set to VREF/2, without varying with respect to the effective level of the power supply voltage VDDA, then an increase in the power supply voltage VDDA, for example, by substantially Δmin or Δmax as shown for this third case, would cause a strong clipping ECR0 at the floor level Vmin and a weak clipping, or even no clipping, at the ceiling level Vmax.

Figure 3:
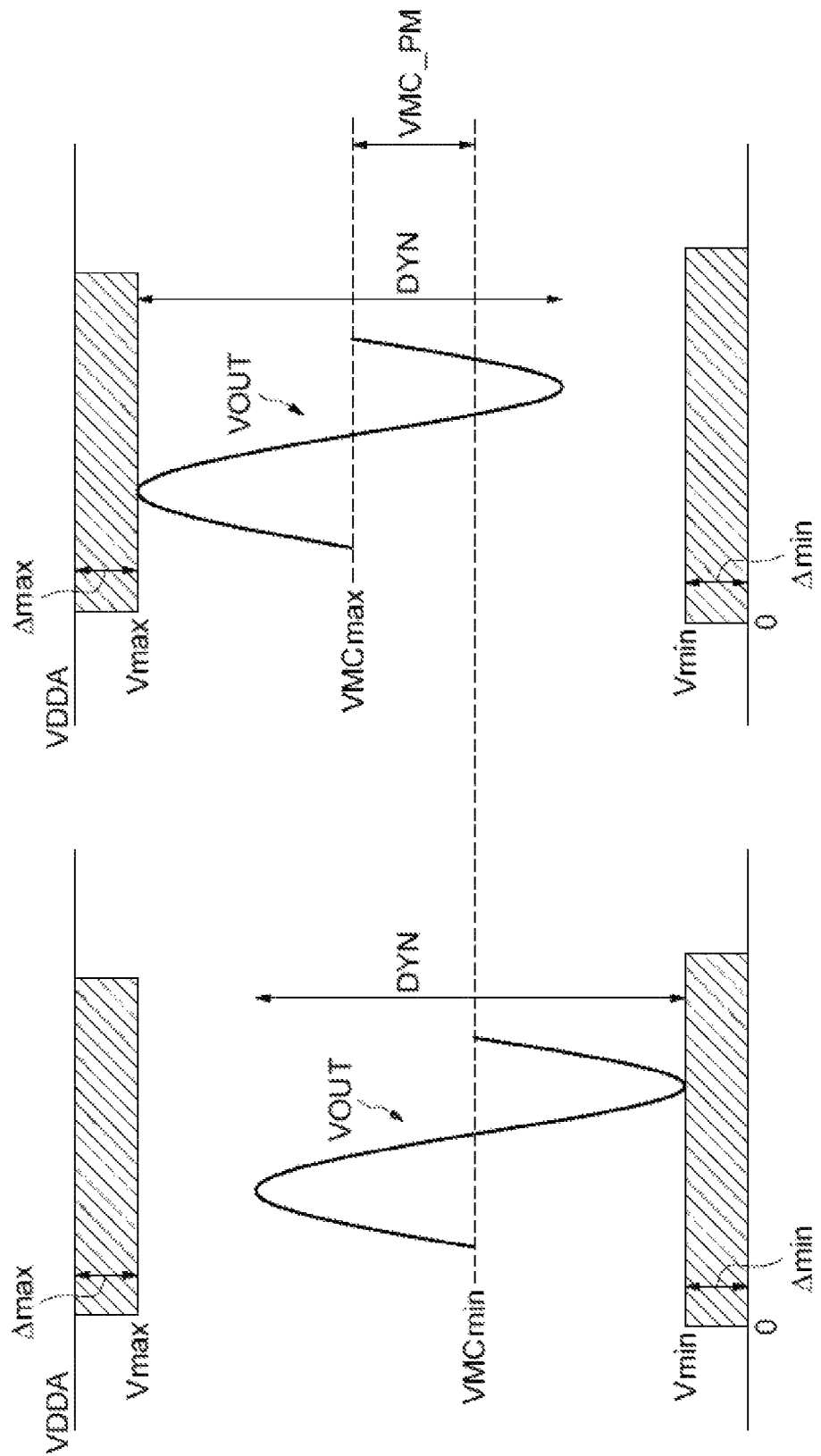
FIG. 3 shows a waveform for an exemplary embodiment.

FIG. 3 shows an exemplary embodiment in which the common-mode adaptation circuit VPgen is configured to position the level of the common-mode voltage VMC in the middle portion VMC_PM at a level located between a lower limit VMCmin and an upper limit VMCmax of the middle portion.

This exemplary embodiment allows to take advantage of a modularity of the level of the common-mode voltage VMC when the power supply voltage VDDA is greater than the reference voltage VREF by a quantity greater than or equal to the range of the zones of dropout voltages Δmin, Δmax "VDDA≥VREF+2Δ", with 2Δ=Δmin+Δmax.

To establish the lower limit of the middle portion VMCmin, the condition is considered in which the output signal VOUT is minimal, that is to say for VDAC=VREF. The minimum level without clipping on the output signal VOUT is the floor level Vmin.

Thus, by replacing the terms corresponding to these conditions in the equation VOUT=2*VP−VDAC, Vmin=2*VPmin−VREF, or VPmin=(Vmin+VREF)/2.

In other words, the generation of this control voltage VPmin by the common-mode adjustment circuit VPgen thus allows to generate the output signal VOUT centered on a common-mode voltage VMC located at half the amplitude of the dynamic range DYN of the output signal VOUT and a margin Δmin above the ground voltage GND.

Likewise, to establish the upper limit of the middle portion VMCmax, the condition is considered in which the output signal VOUT is maximal, that is to say for VDAC=0, the maximum level without clipping on the output signal VOUT being the ceiling level Vmax.

Thus, by replacing the terms corresponding to these conditions in the equation VOUT=2*VP−VDAC, Vmax=2*VPmax−0, or VPmax=Vmax/2.

In other words, the generation of this control voltage VPmax by the common-mode adjustment circuit VPgen thus allows to generate the output signal VOUT centered on a common-mode voltage located at half the amplitude of the dynamic range DYN of the output signal VOUT and a margin Δmax below the power supply voltage VDDA.

Figure 4:
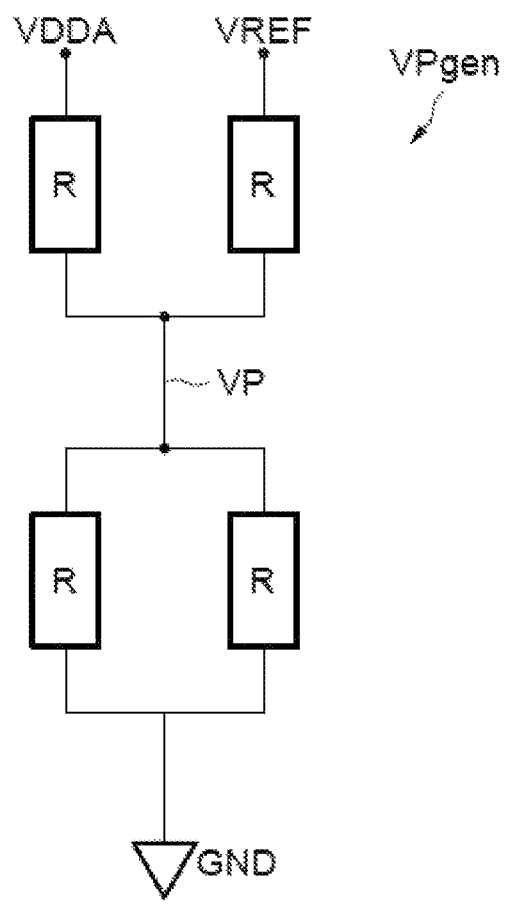
FIG. 4 shows a voltage divider bridge circuit with four resistive elements.
Figure 5:
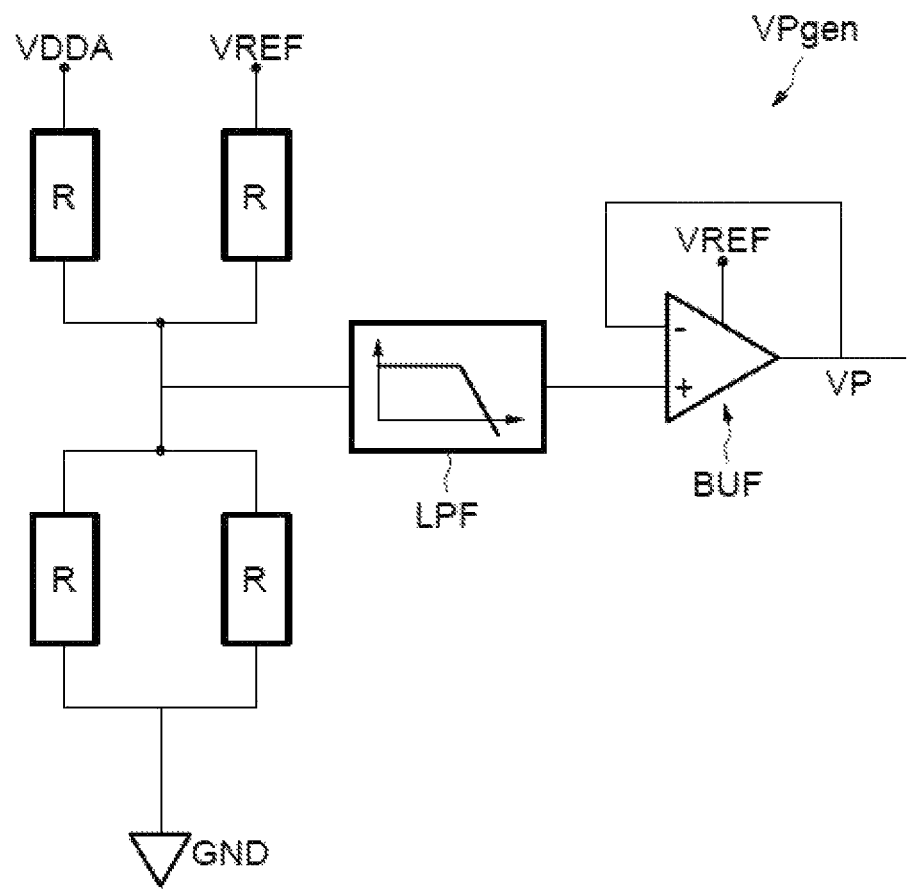
FIG. 5 shows a circuit with a voltage divider bridge, a low-pass filter circuit, and a buffer amplifier.

FIGS. 4 and 5 illustrate exemplary embodiments of the common-mode adaptation circuit VPgen, configured to generate the control voltage VP capable of positioning the level of the common-mode voltage VMC at the level equal to half of the effective power supply voltage VDDA, "VMC=VDDA/2".

As seen above in relation to FIG. 2, to position the level of the common-mode voltage VMC at VDDA/2, the control voltage VP is generated equal to a quarter of the sum of the reference voltage VREF and the power supply voltage VDDA, or VP=(VDDA+VREF)/4.

This operation can be, for example, obtained by a voltage divider bridge circuit with four resistive elements R having identical resistive values, as illustrated by FIG. 4.

Two resistive elements R are coupled in parallel, between the divider node generating the control voltage VP and the power supply voltage VDDA for one and the reference voltage VREF for the other, the two other resistive elements R being coupled in parallel between the divider node VP and the ground GND.

Moreover, as illustrated by FIG. 5, a low-pass filter circuit LPF and a buffer amplifier BUF can be provided on the divider node of the voltage divider bridge circuit with four resistive elements R, to generate a stronger and more stable control voltage VP.

Figure 6:
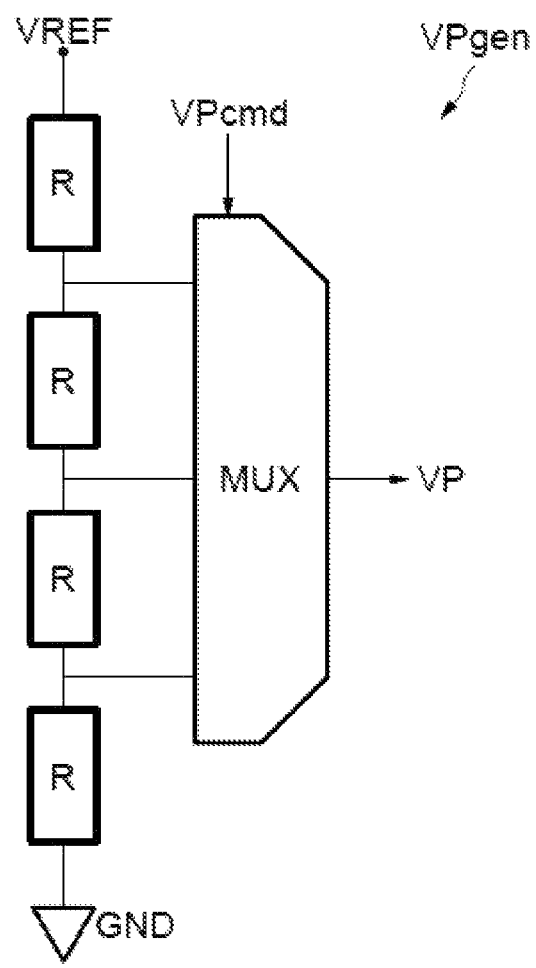
FIGS. 6, 7, and 8 illustrate examples of circuits that can belong to a common-mode adaptation circuit.

FIG. 6 illustrates an example of a circuit that can belong to the common-mode adaptation circuit VPgen configured to position the level of the common-mode voltage VMC in the middle portion VMC_PM, upon command of a control signal VPcmd.

For example, the common-mode adaptation circuit VPgen can include in this respect a series of resistive elements R coupled between the reference voltage VREF and the ground GND as well as a multiplexer element MUX capable of selecting one of the nodes located between the resistive elements R of the series. The output of the multiplexer element thus allows to generate the control voltage VP having a level controlled by the control signal VPcmd.

Figure 7:
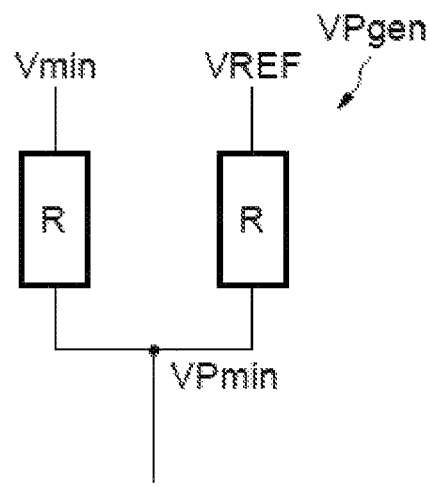

FIG. 7 illustrates an example of a circuit that can belong to the common-mode adaptation circuit VPgen, configured to generate the control voltage VPmin, as described above in relation to FIG. 3, that is to say the control voltage VPmin positioning the lower limit VMCmin of the middle portion of the common-mode voltage VMC_PM.

To generate VPmin=(Vmin+VREF)/2, a voltage divider bridge circuit including two resistive elements R having the same resistive value coupled between a source generating the floor level Vmin and the reference voltage VREF can be used.

Figure 8:
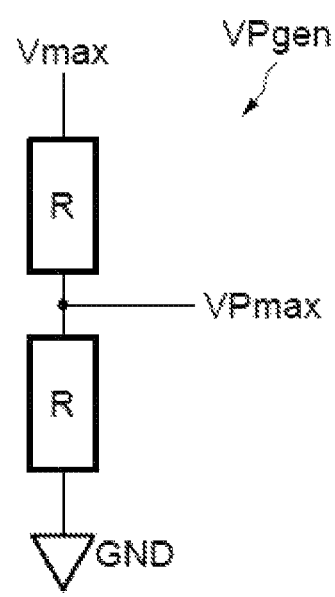

FIG. 8 illustrates an example of a circuit that can belong to the common-mode adaptation circuit VPgen, configured to generate the control voltage VPmax, as described above in relation to FIG. 3, that is to say the control voltage VPmax positioning the upper limit VMCmax of the middle portion of the common-mode voltage VMC_PM.

To generate VPmax=Vmax/2, a voltage divider bridge circuit including two resistive elements R having the same resistive value, coupled between a source generating the ceiling voltage Vmax and the ground GND, can be used.

Moreover, the invention is not limited to the examples of implementations and embodiments described above in relation to FIGS. 1 to 8, but covers all the alternatives thereof, for example, the practical implementations of the circuits of the conversion stage CNV and of the output amplifier can vary with respect to the simplified examples described above, the equations allowing to calculate the value of the common-mode control voltage for the various conditions are adapted accordingly.

What is claimed is:

1. A digital-to-analog converter comprising:
   an output amplifier configured to be powered with a controllable power supply voltage and a ground reference voltage;
   wherein the output amplifier is configured to generate an analog output signal having a dynamic range centered on a common-mode voltage; and
   wherein the output amplifier includes a common-mode adaptation circuit configured to position a level of the common-mode voltage at a level located in a middle portion of an interval of voltages located between the power supply voltage and the ground reference voltage, according to an effective level of the power supply voltage.

2. The digital-to-analog converter according to claim 1, further comprising a conversion stage configured to generate, from a digital code, an analog conversion signal at an input of the output amplifier, the conversion stage having a dynamic range with a peak-to-peak amplitude that is equal to a reference voltage, the output amplifier being configured to generate the analog output signal at the level of the common-mode voltage when the analog conversion signal is at a level equal to half of the reference voltage.

3. The digital-to-analog converter according to claim 2, wherein the conversion stage is configured to have a constant impedance on the input of the output amplifier, the output amplifier being configured to have a unit gain and to be powered by the controllable power supply voltage at a level greater than or equal to the reference voltage.

4. The digital-to-analog converter according to claim 1, wherein the common-mode adaptation circuit is configured to position the level of the common-mode voltage at a level located between a lower limit of the middle portion and an upper limit of the middle portion, the lower limit being located at half the amplitude of the dynamic range of the analog output signal and a margin above the ground reference voltage, and the upper limit being located at half the amplitude of the dynamic range of the analog output signal and a margin below the power supply voltage.

5. The digital-to-analog converter according to claim 1, wherein the common-mode adaptation circuit is configured to position the level of the common-mode voltage in the middle portion, upon command of a control signal.

6. The digital-to-analog converter according to claim 1, wherein the common-mode adaptation circuit is configured to position the level of the common-mode voltage at a level equal to half of the effective power supply voltage.

7. A method for digital-to-analog conversion, the method comprising:
   receiving a controllable power supply voltage and a ground reference voltage;
   generating a common-mode voltage by placing a level of the common-mode voltage in a middle portion of an interval of voltages between the power supply voltage and the ground reference voltage, the placement made according to an effective level of the power supply voltage; and
   generating an analog signal having a dynamic range centered on the common-mode voltage.

8. The method according to claim 7, further comprising generating an output signal by amplifying the analog signal.

9. The method according to claim 8, further comprising generating an analog conversion signal from a digital code, the analog conversion signal having a dynamic range with a peak-to-peak amplitude that is equal to a reference voltage, wherein generating the output signal comprises generating the output signal at the level of the common-mode voltage when the analog conversion signal is at a level equal to half of the reference voltage.

10. The method according to claim 9, wherein generating the output signal comprises generating the output signal with a unit gain and wherein the controllable power supply voltage has a level greater than or equal to the reference voltage.

11. The method according to claim 8, wherein generating the common-mode voltage comprises generating the common-mode voltage at a level between a lower limit of the middle portion and an upper limit of the middle portion, the level of the lower limit being located at half the amplitude of the dynamic range of the output signal and a margin above the ground reference voltage, and the upper limit being located at half the amplitude of the dynamic range of the output signal and a margin below the power supply voltage.

12. The method according to claim 7, wherein generating the common-mode voltage comprises generating the common-mode voltage upon command of a control signal.

13. The method according to claim 7, wherein generating the common-mode voltage comprises generating the common-mode voltage at a level equal to half of the effective power supply voltage.

14. An integrated circuit that includes a digital-to-analog, the digital-to-analog converter comprising:
   a supply reference voltage node;
   a controllable power supply voltage node;
   a ground reference voltage node;
   a conversion stage coupled between the supply reference voltage node and the ground reference voltage node, the conversion stage having an input coupled to a digital code input;
   a common-mode adaptation circuit comprising:
      a first resistor coupled between the controllable power supply voltage node and a divider node;
      a second resistor coupled between the supply reference voltage node and the divider node; and
      third and fourth resistors coupled in parallel between the divider node and the ground reference voltage node, wherein the first, second, third, and fourth resistors have the same resistance value; and
   an amplifier having a first input coupled to an output of the conversion stage and a second input coupled to the divider node of the common-mode adaptation circuit.

15. The integrated circuit according to claim 14, wherein the common-mode adaptation circuit is configured to generate a common-mode voltage at a level located in a middle portion of an interval of voltages located between a power supply voltage carried on the controllable power supply voltage node and a ground voltage carried on the ground reference voltage node, according to an effective level of the power supply voltage.

16. The integrated circuit according to claim 15, wherein the amplifier is configured to generate an analog output signal having a dynamic range centered on the common-mode voltage obtained from the common-mode adaptation circuit.

17. The integrated circuit according to claim 14, further comprising a low pass filter coupled between the divider node of the common-mode adaptation circuit and the second input of the amplifier.

18. An integrated circuit that includes a digital-to-analog, the digital-to-analog converter comprising:
   a supply reference voltage node;
   a controllable power supply voltage node;
   a ground reference voltage node;
   a conversion stage coupled between the supply reference voltage node and the ground reference voltage node, the conversion stage having an input coupled to a digital code input;
   a common-mode adaptation circuit comprising a plurality of resistors coupled in series between the supply reference voltage node and the ground reference voltage node and a multiplexer having a control input and a plurality of data inputs, each data input being coupled to a node between a respective two of the resistors; and
   an amplifier coupled between the controllable power supply voltage node and the ground reference voltage node, the amplifier having a first input coupled to an output of the conversion stage and a second input coupled to an output of the common-mode adaptation circuit.

19. The integrated circuit according to claim 18, wherein the common-mode adaptation circuit is configured to generate a common-mode voltage at a level located in a middle portion of an interval of voltages located between a power supply voltage carried on the controllable power supply voltage node and a ground voltage carried on the ground reference voltage node, according to an effective level of the power supply voltage.

20. The integrated circuit according to claim 19, wherein the amplifier is configured to generate an analog output signal having a dynamic range centered on the common-mode voltage obtained from the common-mode adaptation circuit.

\* \* \* \* \*